Nov. 26, 1968 H. J. BENZULY 3,413,608
NOISE IMMUNE DETECTOR
Filed June 12, 1964 2 Sheets-Sheet 1

INVENTOR.
Harold J. Benzuly
By
Hofgren, Wegner, Allen, Stellman & McCord
ATTORNEYS 3,413,608
NOISE IMMUNE DETECTOR Harold J. Benzuly, Highland Park, Ill., assignor to Warwick Electronics Inc., a corporation of Delaware Filed June 12, 1964, Ser. No. 374,646
14 Claims. (Cl. 340—171)

ABSTRACT OF THE DISCLOSURE

A multiple channel frequency diversity control with multiple amplifier and detector circuits each having an input tuned to a different frequency. The channels are actuated similarly by noise and inversely by a desired control signal. Oppositely poled diodes interconnect the load of each channel so that the channels must be inversely actuated to produce an output. When one channel is actuated, the voltage drop across a resistor connected in common with all channels tends to prevent actuation of the remaining channels.

This invention relates to a noise immune detector circuit and more particularly to a detector for a multiple channel frequency diversity receiver.

Frequency diversity communication systems have found wide use in control work. For example, multiple function remote controls for television receivers generally utilize such a system. Typically, a transmitter emits a sonic wave, above the audible frequency range, and at a different frequency for each of the different control functions to be performed. In the receiver, the sonic wave is converted to an electrical signal, amplified and detected. The detected output signal is utilized to actuate a control element, as a relay. The receiver circuitry must discriminate between the control signal frequencies and between the control signals and noise. Adequate discrimination can be achieved with several cascade connected tuned circuits. However, it is desirable to utilize as few tuned circuits as possible in order that the circuit be economical to manufacture.

A principal object of this invention is the provision of an improved detector with good noise immunity and with an interlocking circuit to prevent actuation of more than one control channel at the same time.

One feature of the invention is that the circuit includes a plurality of detectors connected with a source of signal through circuits tuned to the channel frequencies, each of the detectors having a load circuit. Further circuit means interconnect circuits of each of the detectors whereby the detector circuits are actuated in the same sense by noise and inversely by the control signals.

Another feature is that the signal detectors each have a load impedance connected therewith and control or output elements connected through diodes across the load impedances. When the detectors are actuated by a control signal, one conducts much more heavily than the other, and the difference in potential across the load impedances acts through the diode circuit to energize the appropriate control element. With noise signals, the detectors are substantially equally conductive and the voltage drops across the load impedances cancel. The net voltage applied to the control elements is insufficient to actuate them.

A further feature of the invention is that the detectors are amplifying devices having a common bias resistor. When one detector conducts on reception of a channel signal, the voltage developed across the common bias resistor reduces the sensitivity of the other detectors.

Yet another feature of the invention is the utilization of the voltage across the common detector resistor to provide a gain control for the control circuit amplifiers. With noise, the potential across the common resistor increases, reducing the amplifier gain.

Further features and advantages will readily be apparent from the following application and from the drawings, in which.

Figure 1:
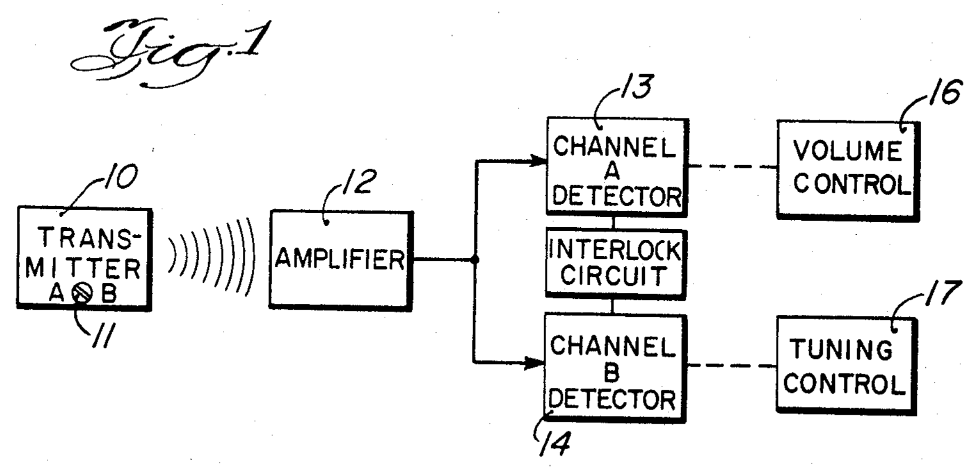
FIGURE 1 is a block diagram of a two channel control system embodying the invention.

While illustrative embodiments of the invention are shown in the drawings and will be described in detail herein, the invention is susceptible of embodiment in many different forms and it should be understood that the present disclosure is to be considered as an exemplification of the principles of the invention and is not intended to limit the invention to the embodiments illustrated. The scope of the invention will be pointed out in the appended claims.

Dual channel remote control systems for television receivers generally effect control of the volume and channel selection of the television receiver. More sophisticated systems also control the on-off condition of the receiver, fine tuning, picture contrast, brightness and the like. This invention is concerned with detector circuit configurations which provide a high degree of noise immunity and adjacent channel signal rejection.

Turning now to FIGURE 1 of the drawings, a transmitter 10 generates and radiates suitable control signals. The frequency of the signal may be selected by control 11 to effect operation of one of two channels, A and B, in the receiver. The sonic signals are received and amplified at 12 and coupled to channel A and channel B detector circuits 13 and 14, respectively. The output of channel A detector 13 may, for example, operate a volume control 16 while the output of channel B detector 14 operates tuning control 17. The signals are directed from the amplifier to the detectors by suitable tuned circuits, as will appear. An interlock circuit 18 connected between the two detectors renders them substantially non-responsive to noise signals (which appear with substantially equal amplitude at each detector) and further, on actuation of one of the detectors in response to a control signal, reduces the sensitivity of the other detector channel. Additional channels may be utilized, as will appear.

During the course of the following description, specific values will be assigned for various of the circuit components. It is to be understood that these values are given for the purpose of providing a complete disclosure of an operative embodiment of the invention. Many changes and substitutions will readily be apparent to those skilled in the art and none of the values are to be considered critical unless specifically so stated.

Figure 2:
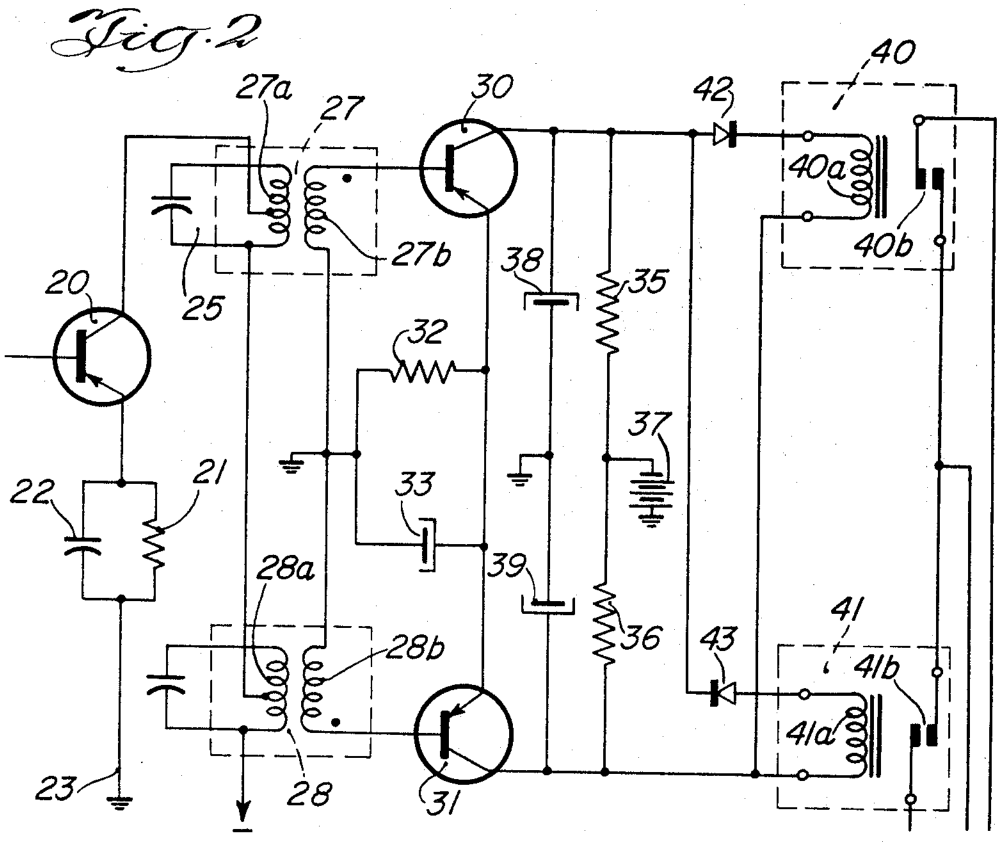
FIGURE 2 is a schematic diagram of a detector circuit illustrating a two channel embodiment of the invention.

In FIGURE 2, a schematic diagram of a preferred two channel embodiment of the invention is shown. Transistor driver amplifier 20 has an emitter bias circuit including resistor 21, 2,200 ohms, shunted by capacitor 22, 0.47 $\mu$f., and returned to a reference potential or ground 23. The driver output circuit is connected with the collector of transistor 20 and includes two series connected, parallel tuned circuits 25 and 26. Tuned circuit 25 is responsive to the channel A frequency, as 38 kilocycles, while circuit 26 is tuned to the channel B frequency, 41.5 kc. The inductor portions of each of tuned circuits 25 and 26 form the primary windings **27*a* and 28*a* of coupling transformers 27 and 28. Secondary windings 27*b* and 28*b* each have one terminal connected with the base input element of the channel A and channel B detector transistors 30 and 31, respectively. The emitters of the detector transistors are connected together and returned to ground through bias resistors 32, 10 ohms, bypassed with capacitor 33, 10 microfarads. Each of the detector transistors has a load circuit connected with the collector element and including load resistors 35 and 36, each 470 ohms. Detector transistors 30 and 31 are energized by a suitable source as battery 37 which has its positive terminal grounded and its negative terminal connected with load resistors 35 and 36**.

The load resistors are heavily bypassed by capacitors 38 and 39, 100 microfarads. Thus, the current through resistors 35 and 36 is essentially a direct current dependent on the average value of the signal level at the base of transistors 30 and 31.

The circuit includes control elements, here shown as the operating coils 40*a* and 41*a* of channel relays 40 and 41. The relay operating coils are connected through reversely poled diodes 42 and 43 across the series combination of load resistors 35 and 36. Energization of either of relays 40 or 41 causes the contacts 40*b*, 41*b* associated therewith to close, effecting the desired control function. Details of the function control circuitry form no part of this invention and are not shown in detail.

With no input signal applied to the system, transistors 30 and 31 are substantially cut off and there is little current flow through the output circuits. The voltage at the collector of each transistor is substantially the same and no potential difference appears across the series combination of the load resistors. No voltage is applied to the relay coils and neither relay is energized.

If a channel A signal (38 kc.) is received, substantially the entire signal appears across tuned circuit 25 and is coupled to the input circuits of detector transistor 30. The high current flow through transistor 30 causes a voltage drop across load impedance 35 with the polarity indicated in the drawing.

The current flow through emitter resistor 32 as a result of the conduction of transistor 30 applies a negative potential to the emitter of transistor 31, holding it in a nonconductive state even though some signal at the channel A frequency may pass through transformer 28. Thus, there is still little or no current flow through load impedance 36 as a result of flow through transistor 31 and the collector of transistor 31 remains at substantially the negative potential of battery 37. The voltage drop across load impedance 35 causes diode 42 to conduct, the current flowing through relay coil 40*a* and energizing relay 40.

Similarly, on occurrence of a channel B control signal, transistor 31 conducts resulting in the application of a forward potential to diode 43 and energizing relay 41. Thus, each channel detector responds to one of the channel control signals and is so interconnected with the other detector that it is prevented from being actuated at the same time.

If the receiver is subjected to a noise signal which has a random frequency distribution, signals of substantially equal amplitude are applied to both detectors 30 and 31. With substantially equal current flow through the two detector transistors and their load impedances 35 and 36, no voltage is applied across the relay circuit and neither of the relays is energized.

Figure 3:
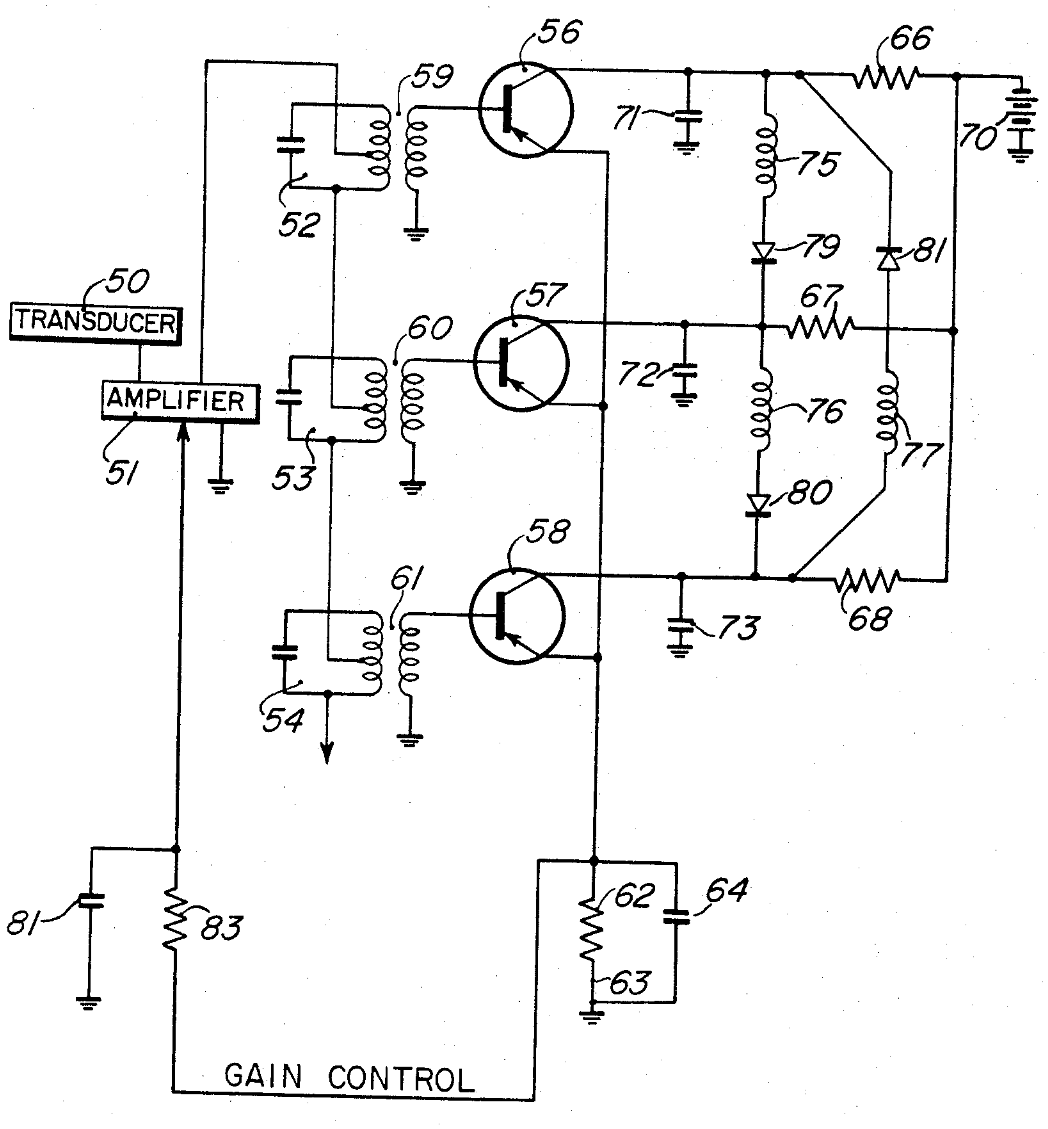
FIGURE 3 is a schematic diagram of a multiple channel detector circuit embodying the invention.

A further embodiment of the invention is shown in FIGURE 3. The control signals from the transmitter are picked up by a transducer 50 and coupled in electrical form to amplifier 51, which may include one or more stages of preamplification and a driver amplifier, as 20 of FIGURE 2. The output circuit of the driver amplifier includes three series connected, parallel tuned circuits 52, 53 and 54. Each of the circuits is tuned to a different frequency for control of three channels, A, B and C. Transistor detectors 56, 57 and 58 each has a base input circuit coupled to the associated tuned circuits by coupling transformers 59, 60 and 61. The emitter elements of each of the transistor detectors are connected together and through a common emitter resistor 62 with ground 63. Emitter resistor 62 is shunted by a capacitor 64. Each of the detector transistors 56, 57 and 58 has an output circuit including an impedance element, 66, 67 and 68, connected between the associated collector electrode and battery 70. The collector load impedances 66–68 are bypassed by capacitors 71, 72 and 73.

The control elements may again comprise the actuating coils of control relays. In the three channel system of FIGURE 3, three control relay coils 75, 76 and 77 are shown. Each is connected between a different pair of collector output elements of the transistor detectors. More specifically, relay coil 75 is connected through diode 79 between the collector of channel A detector 56 and channel B detector 57. Relay coil 76 is connected through diode 80 between the collector of channel B detector 57 and the collector of channel C detector 58. Similarly, relay coil 77 is connected through diode 81 between the collector of channel C detector 58 and the collector of channel A detector 56.

The control system operates in much the same manner as that of FIGURE 2. If a signal at the frequency of channel A is received, transistor 56 conducts dropping the collector essentially to the emitter potential. The resulting current flow through diode 79 and relay coil 75 energizes the channel A relay. Diode 81 is reversely biased, completely blocking current flow through relay coil 77. While some current may flow through diode 80 and relay coil 76, it is insufficient to energize the relay. At the same time, the increase in emitter potential applied to transistors 57 and 58 tends to keep them from conducting should a portion of the channel A signal be applied to their input circuits as a result of incomplete filtering in the tuned circuits. Thus, the actuation of one of the channel detectors tends to prevent actuation of the others.

The operation for channels B and C is identical.

With a noise signal, the voltage at each collector is essentially the same, and no relay is energized.

The voltage at the emitters of the transistors serves a further purpose. The voltage is essentially direct current, due to the bypass action of capacitor 64, and varies in amplitude in accordance with total current passed by all of the detector transistors. This potential may be utilized to provide a gain control signal to the amplifier 51. As indicated in FIGURE 3, the potential at the common emitter point for the transistor detectors is connected through a decoupling circuit of resistor 83 and capacitor 84, to the amplifier. The specific connection to the amplifier circuit may be made in any suitable manner. In the presence of a noise signal which affects each of the detectors, the cumulative detector current establishes a voltage across emitter resistor 62 which acts through the gain control circuit to reduce the gain of amplifier 51. This has an effect of reducing the sensitivity of the receiver during noise conditions.

On the occurrence of a channel signal, a similar effect may be achieved if there is a net increase in the current drawn by all the detector stages. However, the circuit is preferably so designed that the quiescent or no signal current for the three detectors is substantially equal to one-third (in a three channel system) the current drawn by a single detector actuated by a channel signal. Thus, when a channel signal occurs and the two detectors associated with the other channels are cut off (by virtue of the increase in potential of their emitters without a corresponding increase in the base voltage), the total current drawn by the system is unchanged. Thus, there is no effect on the gain control circuit nor the sensitivity of the system during reception of a desired signal. Should the balance described above be difficult to obtain in the circuit illustrated having the base emitter junction of the transistor detectors serving as the detector elements, separate detectors may be incorporated between the coupling transformers and the base input element of each of the transistors.

The three channel system of FIGURE 3 may be expanded to encompass additional channels, by adding further detector stages coupled with the same emitter resistor and interconnected with the relay coil control elements in a similar manner.

I claim:

1. A frequency diversity control circuit, responsive to control signals of different frequencies and subject to random frequency noise, comprising: a source of control signals for actuating selected circuits; a plurality of similar control signal detectors each having an input circuit and an output circuit; a tuned input coupling circuit connected between said source and each of said detector input circuits, each of said coupling circuits being tuned to the frequency of one of said control signals; a plurality of load circuits, one connected with the output circuit of each of said detectors; and circuit means interconnecting the circuits of each of said detectors whereby each of said detector circuits is actuated similarly by noise and inversely to the actuation of a selected detector by said control signals.

2. A dual channel frequency diversity control circuit, responsive to control signals of different frequencies and subject to random frequency noise, comprising:
  a source of control signals;
  a plurality of similar control signal detectors each including a controllable device having first, second and third elements;
  a common resistor connected with the second elements of each of said plurality of controllable devices;
  a plurality of tuned input coupling circuits, each connected between said source and the first element of a different one of said controllable devices, each of said input coupling circuits being tuned to the frequency of a different one of said control signals; and
  load circuits connected with the third elements of said controllable devices and including the operating element of an output device for each of said channels.

3. The control circuit of claim 1 wherein said load circuits are interconnected whereby noise signals affect the load circuits directly while control signals affect the load circuits differentially.

4. A multiple channel frequency diversity control circuit, responsive to control signals of different frequencies and subject to random frequency noise, comprising: a source of control signals, a plurality of similar control signal detectors each having an input circuit and an output circuit; a plurality of tuned input coupling circuits connected respectively between said source and each of said detector input circuits, each of said coupling circuits being tuned to the frequency of one of said control signals; a plurality of load impedance elements, one connected with the output circuit of each of said detectors; a plurality of control elements connected respectively across said load impedance elements; and a diode connected with each of said control elements each diode being poled to conduct only upon actuation of one of said detectors by the related control signal.

5. The frequency diversity control circuit of claim 4 wherein each of said control elements is connected through the associated diode between the output circuits of a pair of said detectors.

6. A dual channel frequency diversity control circuit, responsive to control signals of two different frequencies and subject to random frequency noise, comprising: a source of control signals; a pair of similar control signal detectors each having an input circuit and an output circuit; a tuned input coupling circuit connected between said source and each of said detector input circuits, the first of said coupling circuits being tuned to the frequency of one of said control signals and the second coupling circuit being tuned to the frequency of the other of said control signals; first and second load impedance elements, a different one connected with the output circuit of each of said detectors; first and second control elements connected in parallel with said load impedace elements; and a pair of diodes, a different one connected with each of said control elements and oppositely poled whereby said control elements are differentially actuated by said control signals.

7. A dual channel frequency diversity control circuit, responsive to control signals of two different frequencies and subject to random frequency noise, comprising: a source of control signals; a pair of similar control signal detectors each having an input circuit and an output circuit; a plurality of tuned input coupling circuits connected respectively between said source and each of said detector input circuits, the first of said coupling circuits being tuned to the frequency of one of said control signals and the second coupling circuit being tuned to the frequency of the other of said control signals; first and second load impedance elements, one connected with the output circuit of each of said detectors; first and second control elements both connected in parallel with both of said load impedance elements; and a pair of diodes one connected in series with each of said control elements and oppositely poled whereby said control elements are differentially actuated by said control signals.

8. A dual channel frequency diversity control circuit, responsive to control signals of at least two different frequencies and subject to random frequency noise, comprising: a source of control signals; at least two similar control signal detectors each having an input circuit and an output circuit; a tuned input coupling circuit connected between said source and each of said detector input circuits, each of said coupling circuits being tuned to the frequency of a different one of said control signals; a source of operating potential for said detectors; at least two load impedance elements, one connected between the output circuit of each of said detectors and said source of operating potential; at least two control elements each connected between the output circuits of a different pair of detectors; and at least two diodes one connected in series with each of said control elements whereby said control elements are differentially actuated by said control signals.

9. A dual channel frequency diversity control circuit, responsive to control signals of two different frequencies and subject to random frequency noise, comprising:
  a source of control signals;
  a pair of similar control signal detectors each including a controllable device having second, first and third elements;
  a tuned input coupling circuit connected in phase between said source and each of said first elements, the first of said coupling circuits being tuned to the frequency of one of said control signals and the second of said coupling circuits being tuned to the frequency of the other of said control signals;
  a common resistor connected to the second element of said controllable devices;
  a source of operating potential;
  first and second load impedance elements, one connected between the third of each of said controllable devices and said potential source;
  first and second control elements each connected in parallel with the series combination of said load impedance elements; and
  a pair of diodes one connected in series with each of said control elements whereby said control elements are differentially actuated by said control signals.

10. The control circuit of claim 2 including means for deriving a gain control potential from said common resistor.

11. A frequency diversity control circuit responsive to control signals of different frequencies and subject to random noise, comprising: a source of control signals for actuating selected circuits; a plurality of similar control signal detectors each having an input circuit and an output circuit; a common circuit connected with each of said detectors and through which at least a portion of the detector current of each detector flows; a tuned input coupling circuit connected between said source and each of said detector input circuits, each of said coupling circuits being tuned to the frequency of one of said control signals; a plurality of load circuits, one connected with the output circuit of each of said detectors; circuit means interconnecting the output circuits of each of said detectors whereby each of said detector circuits is actuated similarly by noise and inversely to the actuation of a selected detector by said control signals; and means for deriving an automatic gain control potential from said common impedance.

12. The control circuit of claim 11 wherein said source of control signals includes an amplifier having a variable gain, with said gain control potential deriving circuit connected thereto.

13. A frequency diversity control circuit responsive to control signals of different frequencies and subject to random frequency noise, comprising:

a source of control signals;

a plurality of similar control signal detector circuits each including a controllable device which can be biased into different states of conduction;

a plurality of tuned input coupling circuits, each connected between said source and a different one of said detectors and tuned to a different one of the frequencies of the control signals for driving the associated controllable device into a first state of conduction when the control signal of frequency corresponding to said one frequency is received;

a plurality of load circuits, each connected with a different one of said detectors, each load circuit being actuated when the controllable device associated therewith is driven into said first state of conduction; and means interconnecting the circuits and operative when one of the controllable devices is driven into said first state of conduction for biasing the remaining controllable devices into a state of conduction opposite the state necessary to actuate a load circuit.

14. The control circuit of claim 13 wherein the different states of conduction include conducting and nonconducting states, said first state of conduction corresponding to said conducting state, and said interconnecting means biases the remaining controllable devices towards the nonconducting state when one of said controllable devices is driven into said conducting state.

References Cited

UNITED STATES PATENTS

| | | | |
|---|---|---|---|
| 3,022,493 | 2/1962 | Tschumi et al. | 340—171 |
| 3,040,256 | 6/1962 | Bostwick et al. | 340—171 |
| 3,168,738 | 2/1965 | Curll | 340—171 |
| 3,131,264 | 4/1964 | Chittleburgh et al. | 340—171 |
| 3,183,414 | 5/1965 | Goetz | 340—171 |
| 3,202,967 | 8/1965 | Wolff | 340—171 |
| 3,207,959 | 9/1965 | Miller | 340—171 |

JOHN W. CALDWELL, *Primary Examiner.*

A. J. KASPER, *Assistant Examiner.*